United States Patent
Misumi et al.

(10) Patent No.: US 9,680,315 B2
(45) Date of Patent: Jun. 13, 2017

(54) ON-BOARD CONTROL APPARATUS

(71) Applicants: Ryota Misumi, Nisshin (JP); Akira Umemoto, Nagoya (JP)

(72) Inventors: Ryota Misumi, Nisshin (JP); Akira Umemoto, Nagoya (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 72 days.

(21) Appl. No.: 14/646,108

(22) PCT Filed: Oct. 28, 2013

(86) PCT No.: PCT/JP2013/079128
§ 371 (c)(1),
(2) Date: May 20, 2015

(87) PCT Pub. No.: WO2014/103497
PCT Pub. Date: Jul. 3, 2014

(65) Prior Publication Data
US 2015/0326042 A1    Nov. 12, 2015

(30) Foreign Application Priority Data
Dec. 27, 2012  (JP) ................................. 2012-286154

(51) Int. Cl.
*H02J 7/00* (2006.01)
*H01M 10/44* (2006.01)
(Continued)

(52) U.S. Cl.
CPC ......... *H02J 7/0021* (2013.01); *B60L 11/1861* (2013.01); *B60W 10/00* (2013.01); *G01R 31/3606* (2013.01); *H02J 7/0052* (2013.01)

(58) Field of Classification Search
CPC ............ Y02T 10/7005; Y02T 10/7077; Y02T 10/7055; Y02T 10/46
(Continued)

(56) References Cited

U.S. PATENT DOCUMENTS

2009/0091297 A1* 4/2009 Ishikawa ............. H01M 10/443
320/134
2012/0313562 A1* 12/2012 Murao ................. B60L 3/0046
318/139
2013/0069596 A1* 3/2013 Ochiai ................. B60L 3/0046
320/118

FOREIGN PATENT DOCUMENTS

JP   2002-184469 A   6/2002
JP   2009-073266 A   4/2009
(Continued)

*Primary Examiner* — Nghia Doan
(74) *Attorney, Agent, or Firm* — Sughrue Mion, PLLC

(57) ABSTRACT

An on-board control apparatus has a power generation means that has a communication part; a storage battery that is chargeable by receiving electric power from the power generation means; a control means that is configured to be communicatable with the communication part and controls charging of the storage battery; and a state-of-charge measurement means that measures a state of charge of the storage battery. The control means transmits a signal that is to prohibit charging the storage battery to the communication part when an ignition of a vehicle is turned off, and the state-of-charge measurement means measures the state of charge of the storage battery, during a period of time in which charging the storage battery is prohibited, after the ignition of the vehicle is turned off.

4 Claims, 4 Drawing Sheets

(51) Int. Cl.
*H01M 10/46* (2006.01)
*B60L 11/18* (2006.01)
*G01R 31/36* (2006.01)
*B60W 10/00* (2006.01)

(58) Field of Classification Search
USPC .................................................. 320/104, 108
See application file for complete search history.

(56) References Cited

FOREIGN PATENT DOCUMENTS

| | | | |
|---|---|---|---|
| JP | 2010-030400 | A | 2/2010 |
| JP | 2011-257226 | A | 12/2011 |
| JP | 2012-186877 | A | 9/2012 |
| WO | 2012/049973 | A1 | 4/2012 |

* cited by examiner

ON-BOARD CONTROL APPARATUS

CROSS REFERENCE TO RELATED APPLICATIONS

This is a National Stage of International Application No. PCT/JP2013/079128 filed Oct. 28, 2013, claiming priority based on Japanese Patent Application No. 2012-286154 filed Dec. 27, 2012, the contents of all of which are incorporated herein by reference in their entirety.

TECHNICAL FIELD

The present invention relates to an on-board control apparatus.

BACKGROUND ART

In the prior art, a method is known by which the SOC (State Of Charge) of a lead battery is estimated from the OCV (Open Circuit Voltage) thereof in parking of a vehicle (the ignition being turned off) by using a fact that the SOC and the OCV have approximately a linear relation.

However, due to polarization occurring in the lead battery during the vehicle travelling, the OCV is not stabilized immediately after parking of the vehicle. As a result, actual measurement of the SOC is carried out after the elimination of the polarization voltage after the parking. Thus, a long time may be required until the SOC can be measured. For example, a method has been proposed where a lead battery is discharged for a part of the remaining capacity, then a predetermined time is measured for the elimination of polarization, and thereafter, the OCV of the lead battery is measured, or so. However, the measurement accuracy may be degraded (for example, see Patent Reference No. 1).

PRIOR ART REFERENCE

Patent Reference

Patent Reference No. 1: Japanese Laid-Open Patent Application No. 2009-73266

SUMMARY OF THE INVENTION

Problem to be Solved by the Invention

Due to a recent trend of applying a multi-power supply, the number of cases of charging an on-board lead battery during parking of a vehicle increases (for example, charging from a plug-in charger, a solar battery, or so). Because the OCV during parking of a vehicle is not stabilized, it has been becoming difficult to measure the state of charge of a battery (SOC measurement) during parking of a vehicle with high accuracy.

The present invention has been devised in consideration of the above-mentioned point, and is to provide an on-board control apparatus by which it is possible to measure the state of charge of a battery during parking of a vehicle with high accuracy.

Means for Solving the Problem

The on-board control apparatus includes a power generation means that includes a communication part; a storage battery that is chargeable by receiving electric power from the power generation means; a control means that is configured to be communicatable with the communication part and controls charging of the storage battery; and a state-of-charge measurement means that measures a state of charge of the storage battery. The control means transmits a signal that is to prohibit charging the storage battery to the communication part when an ignition of a vehicle is turned off, and the state-of-charge measurement means measures the state of charge of the storage battery during a period of time in which charging the storage battery is prohibited after the ignition of the vehicle is turned off.

Advantageous Effect of the Invention

According to the present invention, it is possible to provide an on-board control apparatus by which it is possible to measure the state of charge of a battery during parking of a vehicle with high accuracy.

MODES FOR CARRYING OUT THE INVENTION

Figure 1:
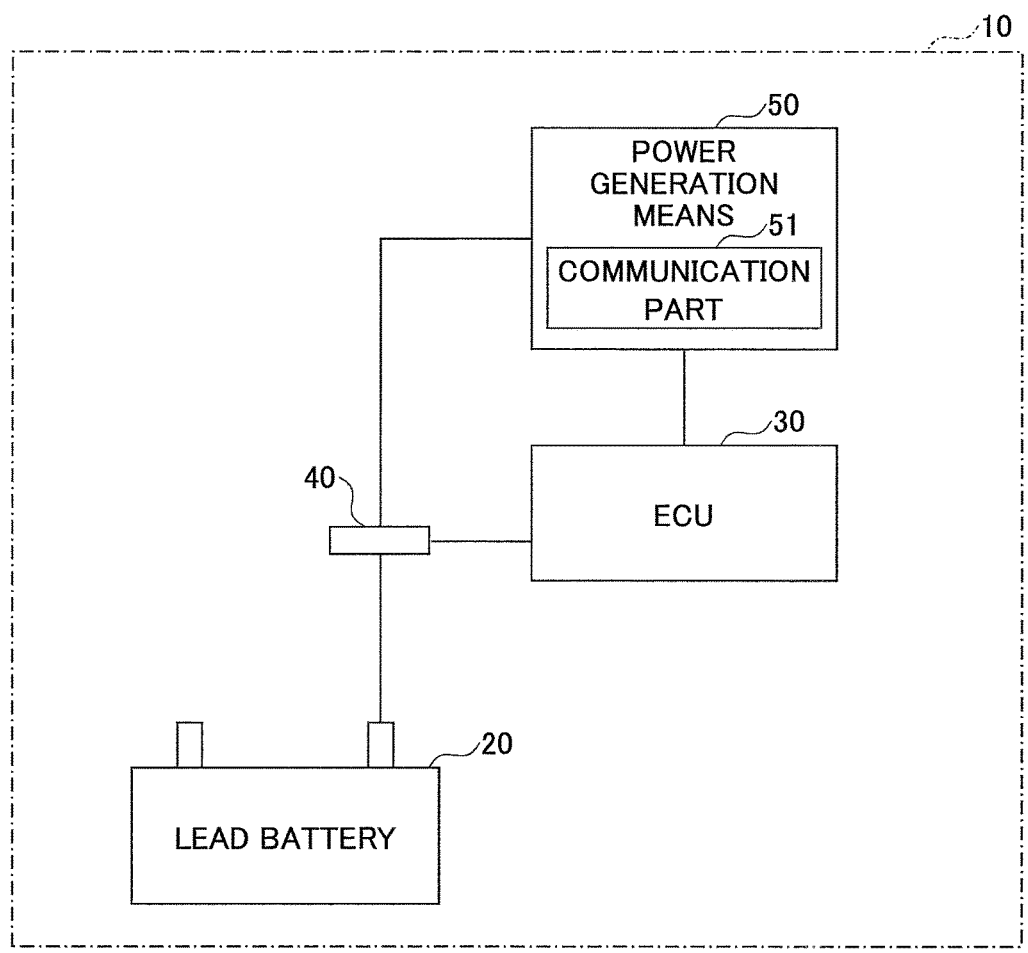
FIG. 1 is a block diagram illustrating an on-board control apparatus according to a first embodiment.

Below, modes for carrying out the invention will be described with reference to the drawings. Note that in the respective drawings, the same reference numerals are given to the same components and duplicate description may be omitted.

FIG. 1 is a block diagram illustrating an on-board control apparatus according to a first embodiment. With reference to FIG. 1, the on-board control apparatus 10 according to the first embodiment is mounted in a vehicle not shown. The on-board control apparatus 10 includes, as main components, a lead battery 20, an ECU 30, a battery sensor 40 and a power generation means 50.

In the on-board control apparatus 10, the lead battery 20 is a storage battery having a function of supplying operational electric power to predetermined on-board apparatuses (not shown). The lead battery 20 is chargeable by receiving electric power from generation by an alternator that generates electric power through rotation of an on-board engine or regeneration occurring when the vehicle reduces its speed or from the power generation means 50. Note that the lead battery 20 is a typical example of a storage battery according to the present invention. However, the storage battery according to the present invention is not limited to the lead battery and can be another secondary battery where polarization occurs as a result of being charged.

The ECU 30 (electronic control unit 30) mainly includes a microcomputer, and is a unit carrying out charging control of the lead battery 20, and so forth. The ECU 30 is configured to be able to communicate with (able to transmit data to and receive data from) a communication part 51 of the power generation means 50, another ECU (electronic control unit) (not shown) mounted in the vehicle, and so forth, through wires, communication such as a CAN, or so. Note that the ECU 30 is a typical example of a control means according to the present invention.

The battery sensor 40 is mounted on the minus terminal of the lead battery 2. The battery sensor 40 has a microcomputer inside and is a state-of-charge measurement means that measures the OCV (open circuit voltage) of the lead battery 20 and measures the SOC (the state of charge of the lead battery 20) based on the measured OCV. The battery sensor 40 is capable of transmitting and receiving a signal according to a predetermined protocol, for example, LIN communication or so, with the ECU 30 bidirectionally.

The power generation means 50 is a solar battery that generates electric power from energy from sunlight and is mounted on, for example, the roof of the vehicle or so. The power generation means 50 is configured to be able to charge the lead battery 20 through, for example, a DC-DC converter (not shown). The power generation means 50 includes the communication part 51 and the communication part 51 has a microcomputer inside. Thus, the power generation means 50 is configured to be able to communicate with (able to transmit data to and receive data from) the ECU 30.

Note that the power generation means 50 is not limited to a solar battery. For example, the power generation means 50 can be a battery that generates electric power from energy of heat (exhaust heat) generated from the vehicle, vibration energy generated from the vehicle, or so.

Operations will now be described for when the on-board control apparatus 10 measures the state of charge of the lead battery 20 in parking of the vehicle. First, the ECU 30 transmits a signal (a charge prohibiting signal) that is to prohibit charging the lead battery 20 to the communication part 51, when the ignition of the vehicle is turned off. In response to the communication part 51 receiving the charge prohibiting signal, the power generation means 50 waits without charging the lead battery 20.

Note that when the ignition is turned off means, for example, a period of time from an instruction to turn off the ignition being output to an ignition relay (not shown) provided on a power line being turned off. Information concerning the ignition can be acquired from a power supply ECU or so via an on-board LAN or so.

However, the signal to prohibit charging the lead battery 20 is transmitted to the communication part 51 from the ECU 30 based on an operation of turning of the ignition of the vehicle. Therefore, a subtle order between the timing of transmission and the timing of the ignition relay (not shown) being turned off counts for nothing. That is, the timing of the signal to prohibit charging the lead battery 20 being transmitted can be before the timing of the ignition relay (not shown) being turned off, the same time as the timing of the ignition relay being turned off or after the timing of the ignition relay being turned off.

Next, the battery sensor 40 measures the state of charge (SOC) of the lead battery 20 while charging the lead battery 20 is prohibited after the ignition of the vehicle is turned off. The battery sensor 40 is capable of acquiring information as to whether the ignition of the vehicle has been turned off (the ignition relay has been turned off) directly from the power supply ECU through the on-board LAN or so, or via the ECU 30.

Figure 2:
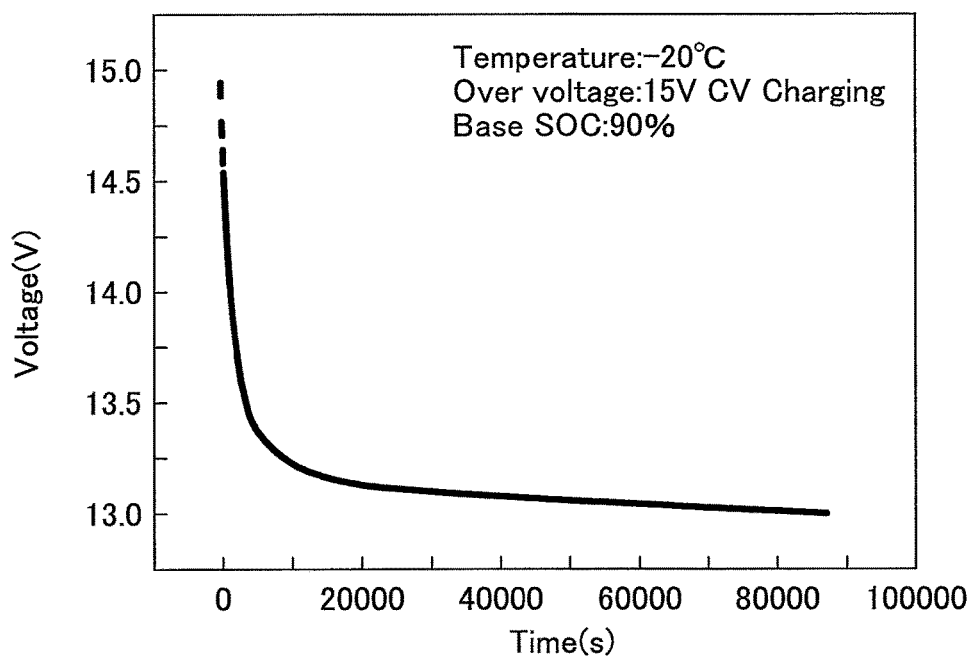
FIG. 2 illustrates a temporal change of an open circuit voltage (OCV) after charging is stopped.
Figure 3:
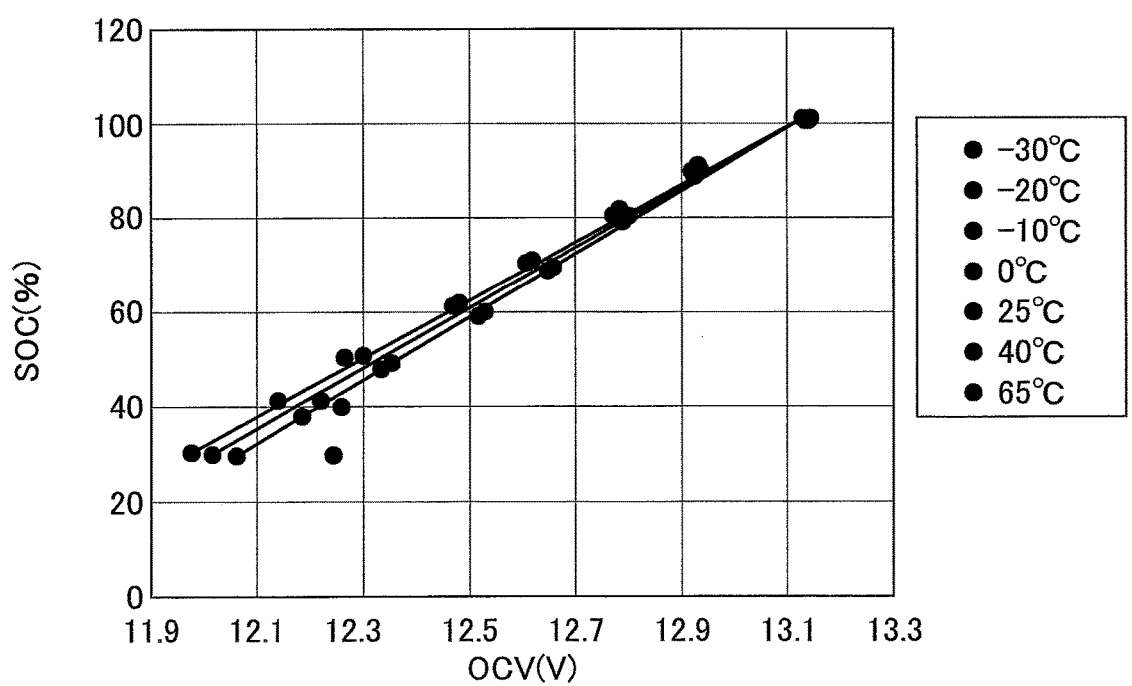
FIG. 3 illustrates relationships between an open circuit voltage (OCV) and a state of charge (SOC).

Measurement of the SOC is carried out, for example, by using relationships of FIGS. 2 and 3. That is, as in FIG. 2, after a sufficient time has elapsed from when charging the lead battery was stopped, the polarization is weakened, the OCV is stabilized, and at the time, the SOC and the OCV have a correlation, for example, as that shown in FIG. 3. Then, the battery sensor 40 measures the OCV of the lead battery 20 and measures the SOC based on the measured OCV. The measurement result of the SOC is transmitted to the ECU 30.

Next, after the measurement of the SOC by the battery sensor 40 is finished, the ECU 30 transmits a signal that is to permit charging the lead battery 20 (a charge permitting signal) to the communication part 51. In response to the communication part 51 receiving the charge permitting signal, the power generation means 50 starts charging the lead battery 20.

Thus, in the on-board control apparatus according to the first embodiment, when the ignition of the vehicle is turned off in parking of the vehicle, the signal to prohibit charging the lead battery is transmitted to the power generation means. The battery sensor measures the state of charge of the lead battery during a period of time in which charging the lead battery is prohibited even after the ignition of the vehicle is turned off. As a result, it is possible to avoid a state where the OCV is not stabilized due to charging the lead battery by the power generation means, and it is possible to measure the state of charge of the lead battery (it is possible to measure the SOC) in parking of the vehicle with high accuracy.

<Variant Example of First Embodiment>

As a variant example of the first embodiment, an example of operations of an on-board control apparatus in a case where a plurality of batteries are mounted in the vehicle will be shown. Note that, for the variant example of the first embodiment, description of the same components as those of the above-described embodiment will be omitted.

Figure 4:
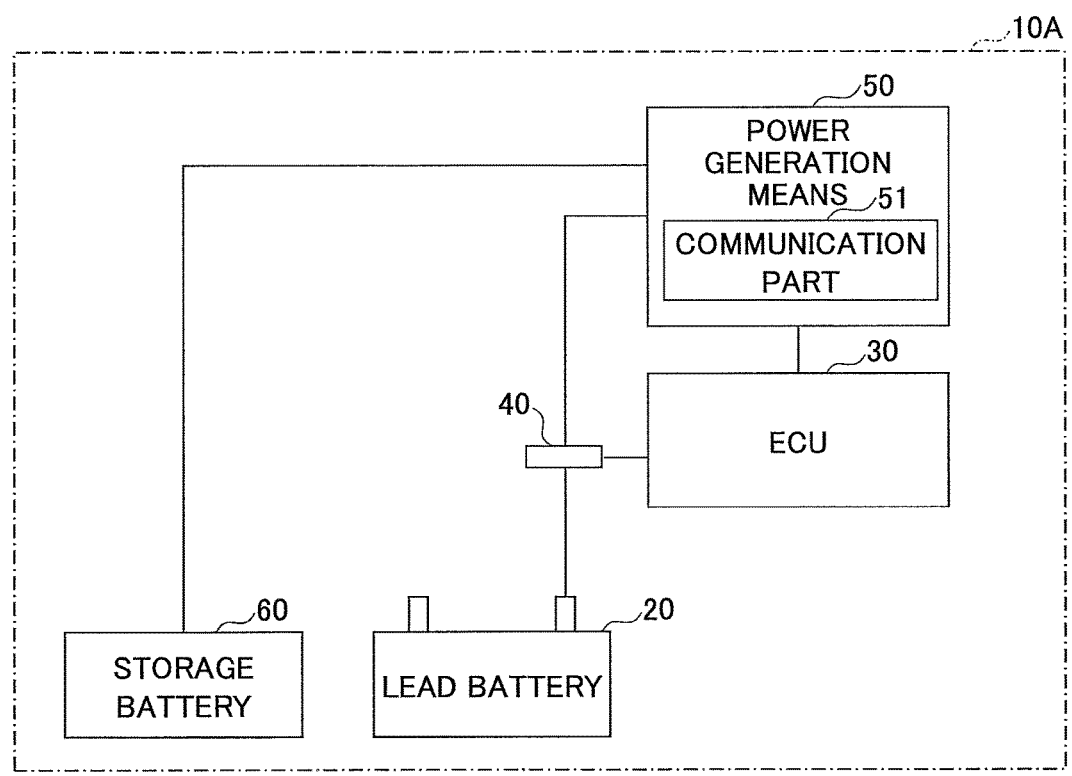
FIG. 4 is a block diagram illustrating an on-board control apparatus in a variant example of the first embodiment.

FIG. 4 is a block diagram illustrating an on-board control apparatus in the variant example of the first embodiment. With reference to FIG. 4, the on-board control apparatus 10A according to the variant example of the first embodiment is different from the on-board control apparatus 10 according to the first embodiment (see FIG. 1) in that a storage battery 60 is added.

The storage battery 60 is, for example, a chargeable/dischargeable secondary battery of a lithium ion, nickel-hydride, or so, having a function of, as an auxiliary battery of the lead battery 20, supplying operational electric power to predetermined on-board apparatuses (not shown) mounted in the vehicle. The storage battery 60 is chargeable by receiving electric power from generation by an alternator that generates electric power through rotation of an on-board engine or regeneration occurring when the vehicle reduces its speed or from the power generation means 50. The power generation means 50 is capable of supplying electric power to the storage battery 60 according to an instruction from the ECU 30. Note that the storage battery 60 is a typical example of a second storage battery according to the present invention.

When the plurality of batteries are thus mounted in the vehicle, it is preferable that the ECU 30 has, in addition to the functions shown for the first embodiment, the following function. That is, the ECU 30 preferably has a function of previously determining a time zone (timing) in which charging the lead battery 20 is prohibited.

For example, the ECU 30 can have a function of carrying out control such as to switch the battery to charge each time the vehicle is parked, or so. Specifically, the lead battery 20 is charged by the power generation means 50 in the next parking of the vehicle; and, in the further next parking of the vehicle, charging the lead battery 20 by the power generation means 50 is prohibited and the storage battery 60 is charged, or so. In the time zone in which charging the lead battery 20 is prohibited, the battery sensor 40 measures the state of charge of the lead battery 20.

Note that, in this case, the ECU 30 can transmit a signal that is to prohibit charging the lead battery 20 and transmit a signal that is to permit charging the storage battery 60 to the communication part 51 when the ignition of the vehicle is turned off in a time zone in which charging the lead battery 20 is prohibited. The state of charge of the lead battery 20 can be measured while the storage battery 60 is being charged after the ignition of the vehicle is turned off.

Also in this case, the lead battery 20 is charged by the power generation means 50 in the previous parking of the vehicle. Therefore, it is possible to avoid such a problem that the charged amount of the lead battery 20 is remarkably reduced even when the battery sensor 40 measures the state of charge of the lead battery 20 without charging the lead battery 20 by the power generation means 50 at the current parking of the vehicle.

Thus, in the on-board control apparatus according to the variant example of the first embodiment, it is possible, in a time zone (timing), to positively avoid a state where the OCV is not stabilized as a result of the power generation means charging the lead battery, by previously determining the time zone in which charging the lead battery is prohibited. Therefore, it is possible to measure the state of charge of the lead battery (it is possible to measure the SOC) with high accuracy during parking of the vehicle.

<Second Embodiment>

As a second embodiment, an example will be illustrated where polarization in the lead battery will be eliminated early. Note that, for the second embodiment, description of the same components as those of the above-described embodiments will be omitted.

Figure 5:
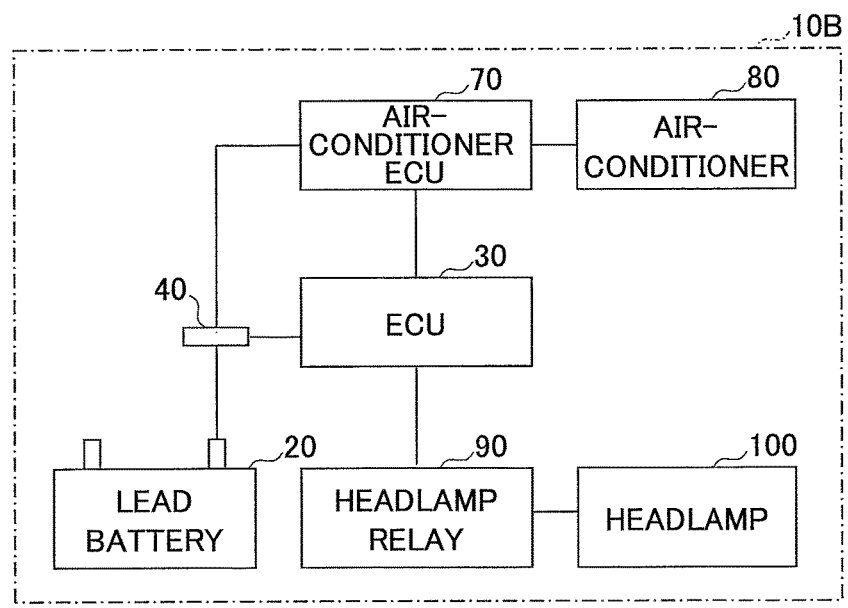
FIG. 5 is a block diagram illustrating an on-board control apparatus according to a second embodiment.

FIG. 5 is a block diagram illustrating an on-board control apparatus according to the second embodiment. With reference to FIG. 5, the on-board control apparatus 10B according to the second embodiment is mounted in a vehicle not shown. The on-board control, apparatus 10B includes, as main components, the lead battery 20, the ECU 30, the battery sensor 40, an air-conditioner ECU 70, an air-conditioner 80, a headlamp relay 90 and a headlamp 100.

The air-conditioner ECU 70 (the air-conditioner electronic control unit 70) mainly includes a microcomputer, and is a unit carrying out control of the air-conditioner 80 and so forth. The air-conditioner ECU 70 is connected to the ECU 30 via an on-vehicle LAN such as a CAN or directly, and is configured to be able to transmit data to and receive data from the ECU 30. The air-conditioner 80 is an apparatus which receives the electric power from the lead battery 20 and carries out air conditioning in the vehicle, and operates according to an instruction from the air-conditioner ECU 70.

The headlamp relay 90 is a relay turned on and turned off according to instructions from the ECU 30. The headlamp 100 is a device receiving the electric power from the lead battery 20 and emitting light toward the outside of the vehicle, and is activated when the headlamp relay 90 is turned on according to an instruction from the ECU 30.

A method of eliminating polarization early in the lead battery 20 before the battery sensor 40 starts measuring the state of charge of the lead battery 20 will now be described. The ECU 30 is capable of eliminating polarization in the lead battery 20 early by discharging the lead battery 20 for a high power load in a short period of time after the ignition of the vehicle is turned off.

Specifically, for example, the ECU 30 activates the air-conditioner 80 by sending an instruction to the air-conditioner ECU 70 after the ignition of the vehicle is turned off. Alternatively, the ECU 30 activates the headlamp 100 by sending an instruction that is to turn on the headlamp relay 90 after the ignition of the vehicle is turned off.

Note that it is also possible that the ECU 30 simultaneously activates both the air-conditioner 80 and the headlamp 100 after the ignition of the vehicle is turned off. Alternatively, it is also possible that the ECU 30 activates another load(s) (for example, a heater, an audio device and/or the like) (not shown) which is activated when receiving electric power from the lead battery 20, after the ignition of the vehicle is turned off, together simultaneously with the air-conditioner 80 and/or the headlamp 100, or solely.

Thus, in the on-board control apparatus according to the second embodiment, the lead battery is discharged for a high power load for a predetermined period of time according to an instruction from the ECU before the battery sensor starts measuring the state of charge of the lead battery after the ignition of the vehicle is turned off. As a result, the OCV is stabilized because polarization in the lead battery is eliminated early, and therefore, as a result of thereafter the battery sensor measuring the state of charge of the lead battery, it is possible to measure the state of charge of the lead battery with high accuracy within a short period of time during parking of the vehicle.

Note that it is possible to apply the second embodiment to the first embodiment. For example, it is possible that, in parking of the vehicle, when the ignition of the vehicle is turned off, the ECU 30 transmits a signal that is to prohibit charging the lead battery 20 to the power generation means 50. Then, it is possible that, before the battery sensor 40 starts measuring the state of charge of the lead battery 20 after the ignition of the vehicle is turned off, discharging for a high power load is carried out for a predetermined period of time.

<Variant Example of Second Embodiment>

As a variant example of the second embodiment, an example of operations of an on-board control apparatus in a case where a plurality of batteries are mounted in the vehicle will be shown. Note that for the variant example of the second embodiment, description of the same components as those of the above-described embodiments will be omitted.

Figure 6:
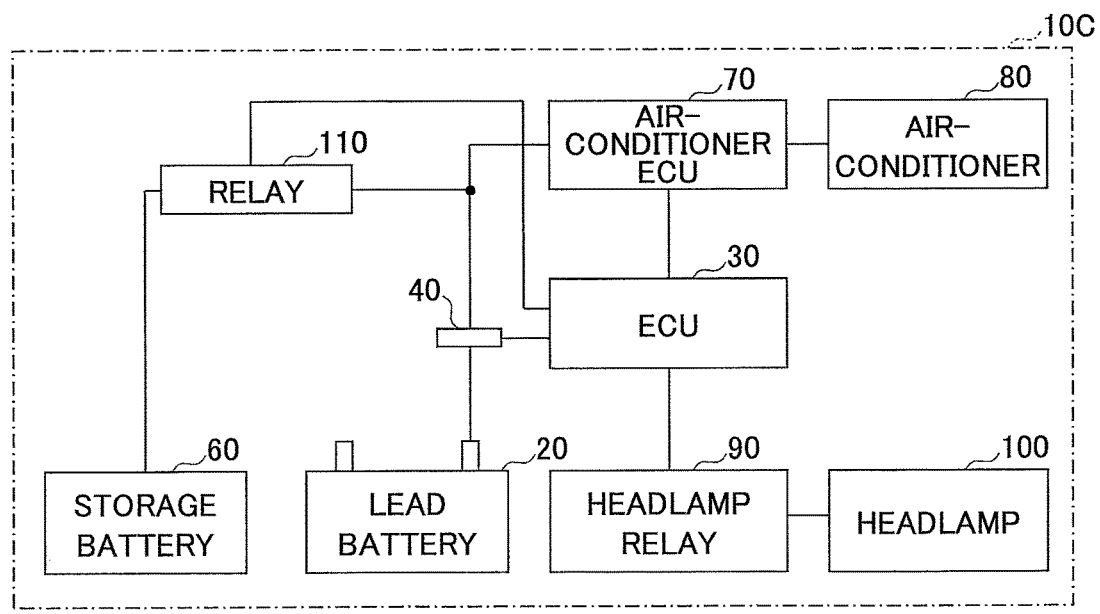
FIG. 6 is a block diagram illustrating an on-board, control apparatus in a variant example of the second embodiment.

FIG. 6 is a block diagram illustrating an on-board control apparatus in the variant example of the second embodiment. With reference to FIG. 6, the on-board control apparatus 100 according to the variant example of the second embodiment is different from the on-board control apparatus 10B according to the second embodiment (see FIG. 5) in that the storage battery 60 is added.

The storage battery 60 is connected to the lead battery 20 via a relay 110. The relay 110 is a relay turned on and turned off according to instructions from the ECU 30. The storage battery 60 is configured to be able to be charged from the lead battery 20 when the relay 110 is turned on according to an instruction from the ECU 30. For example, the voltage from the lead battery 20 is converted by a DC-DC converter not shown to such a voltage as to be able to charge the storage battery 60 and the storage battery 60 is charged.

A method of eliminating polarization early in the lead battery 20 before the battery sensor 40 starts measuring the state of charge of the lead battery 20 will now be described.

In this embodiment, the ECU 30 sends an instruction that is to turn on the relay 110 after the ignition of the vehicle is turned off, and discharges charge of the lead battery 20 by charging the storage battery 60 from the lead battery 20. Thereby, it is possible to eliminate polarization early in the lead battery 20.

Thus, in the on-board control apparatus according to the variant example of the second embodiment, the storage battery 60 is charged from the lead battery 20 according to an instruction from the ECU 30 before the battery sensor starts measuring the state of charge of the lead battery after the ignition of the vehicle is turned off. As a result, the OCV is stabilized because polarization in the lead battery is eliminated early, and therefore, as a result of thereafter the battery sensor measuring the state of charge of the lead battery, it is possible to measure the state of charge of the lead battery with high accuracy in a short period of time during parking of the vehicle.

Note that it is possible to apply the variant example of the second embodiment to the variant example of the first embodiment. For example, it is possible that, in parking of the vehicle, when the ignition of the vehicle is turned off, the ECU 30 transmits a signal that is to prohibit charging the lead battery 20 to the power generation means 50. Then, it is possible that, before the battery sensor 40 starts measuring the state of charge of the lead battery 20 after the ignition of the vehicle is turned off, the storage battery 60 is charged from the lead battery 20.

Thus, the preferable embodiments and the variant examples thereof have been described in detail. However, the present invention is not limited to the above-described embodiments and variant examples thereof, and various modifications or replacements can be made on the above-described embodiments or variant examples thereof without departing from the scope of the present invention.

The present international application claims the priority of Japanese Patent Application No. 2012-286154 filed Dec. 27, 2012 and the entire contents of Japanese Patent Application No. 2012-286154 are incorporated in the present international application.

DESCRIPTION OF REFERENCE NUMERALS 10, 10A, 10B, 10C on-board control-apparatuses
20 lead battery
30 ECU
40 battery sensor
50 power generation means
51 communication part
60 storage battery
70 air-conditioner ECU
80 air-conditioner
90 headlamp relay
100 headlamp
110 relay

The invention claimed is:

1. An on-board control apparatus comprising:
 a power generation part that includes a communication part;
 a storage battery that is chargeable by receiving electric power from the power generation part;
 a control part that is communicatable with the communication part and controls charging of the storage battery;
 a state-of-charge measurement part that measures a state of charge of the storage battery, wherein
 the control part transmits a signal that is to prohibit charging the storage battery to the communication part when an ignition of a vehicle is turned off, and
 the state-of-charge measurement part measures the state of charge of the storage battery after an elapse of a predetermined time from prohibition of charging during a period of time in which charging the storage battery is prohibited after the ignition of the vehicle is turned off; and
 a second storage battery that is chargeable by receiving electric power from the power generation part, wherein
 the control part previously determines a time zone of prohibiting charging the storage battery, and
 the state-of-charge measurement part measures the state of charge of the storage battery in the time zone.

2. The on-board control apparatus as claimed in claim 1, wherein
 the control part transmits a signal that is to permit charging the battery after measurement of the state of charge of the storage battery is finished.

3. The on-board control apparatus as claimed in claim 1, wherein
 the control part transmits a signal that is to prohibit charging the storage battery and transmits a signal that is to permit charging the second storage battery, when the ignition of the vehicle is turned off in the time zone, and
 the state-of-charge measurement part measures the state of charge of the storage battery while the second storage battery is being charged after the ignition of the vehicle is turned off.

4. The on-board control apparatus as claimed in claim 1, wherein
 the power generation part generates electric power from energy of light, heat or vibration.

* * * * *